(12) United States Patent
Roca I. Cabarrocas et al.

(10) Patent No.: US 8,421,074 B2
(45) Date of Patent: Apr. 16, 2013

(54) SEMICONDUCTOR DEVICE WITH HETEROJUNCTIONS AND AN INTERDIGITATED STRUCTURE

(75) Inventors: Pere Roca I. Cabarrocas, Villebon sur Yvette (FR); Jerome Damon-Lacoste, Antony (FR)

(73) Assignees: Centre National de la Recherche Scientifique (CNRS), Paris (FR); Ecole Polytechnique, Palaiseau (FR)

( * ) Notice: Subject to any disclaimer, the term of this patent is extended or adjusted under 35 U.S.C. 154(b) by 0 days.

(21) Appl. No.: 13/017,397

(22) Filed: Jan. 31, 2011

(65) Prior Publication Data

US 2011/0120541 A1 May 26, 2011

Related U.S. Application Data

(62) Division of application No. 11/813,676, filed as application No. PCT/FR2006/050021 on Jan. 18, 2006, now Pat. No. 7,935,966.

(30) Foreign Application Priority Data

Jan. 20, 2005 (FR) ...................................... 05 50174

(51) Int. Cl.
*H01L 29/04* (2006.01)
*H01L 31/0376* (2006.01)
*H01L 31/20* (2006.01)
*H01L 31/036* (2006.01)

(52) U.S. Cl.
USPC ......... 257/52; 257/53; 257/461; 257/E31.048

(58) Field of Classification Search .................. None
See application file for complete search history.

(56) References Cited

U.S. PATENT DOCUMENTS

| 4,064,521 A | 12/1977 | Carlson |
| 4,133,698 A | 1/1979 | Chiang et al. |
| 4,234,352 A | 11/1980 | Swanson |
| 4,253,882 A | 3/1981 | Dalal |
| 4,358,782 A * | 11/1982 | Takasuka et al. ............... 257/54 |
| 4,378,460 A | 3/1983 | Williams |

(Continued)

FOREIGN PATENT DOCUMENTS

| EP | 0 776 051 A2 | 5/1997 |
| FR | 2 833 752 A1 | 6/2003 |

(Continued)

OTHER PUBLICATIONS

P. Verlinden et al., "Muiltleval Metallization for Large Area Point-Contact Solar Cells", Proceedings of the International Photovoltaic Energy Conference, XP000044541, vol. 2, May 9-13, 1988, pp. 1466-1471.

*Primary Examiner* — Zandra Smith
*Assistant Examiner* — Khanh Duong
(74) *Attorney, Agent, or Firm* — Oblon, Spivak, McClelland, Maier & Neustadt, L.L.P.

(57) ABSTRACT

A Semiconductor device including, on at least one surface of a layer made of a crystalline semiconductor material of a certain type of conductivity, a layer made of an amorphous semiconductor material, doped with a type of conductivity opposite to the type of conductivity of the crystalline semiconductor material layer, characterized in that the concentration of the doping elements in the amorphous semiconductor layer varies gradually.

6 Claims, 6 Drawing Sheets

U.S. PATENT DOCUMENTS

| | | |
|---|---|---|
| 4,927,770 A | 5/1990 | Swanson |
| 5,053,083 A | 10/1991 | Sinton |
| 5,066,340 A | 11/1991 | Iwamoto et al. |
| 5,213,628 A | 5/1993 | Noguchi et al. |
| 5,288,338 A | 2/1994 | Morikawa |
| 5,401,336 A | 3/1995 | Noguchi et al. |
| 5,641,362 A | 6/1997 | Meier |
| 5,973,260 A | 10/1999 | Tange et al. |
| 6,180,869 B1 | 1/2001 | Meier et al. |
| 6,274,402 B1 | 8/2001 | Verlinden et al. |
| 6,333,457 B1 | 12/2001 | Mulligan et al. |
| 6,426,235 B1 | 7/2002 | Matsushita et al. |
| 6,452,090 B2 | 9/2002 | Takato et al. |
| 6,927,417 B2 | 8/2005 | Nagashima et al. |
| 7,199,395 B2 | 4/2007 | Terakawa et al. |
| 2005/0270867 A1 | 12/2005 | Jaussaud et al. |
| 2006/0275936 A1 | 12/2006 | Ribeyron et al. |

FOREIGN PATENT DOCUMENTS

| | | |
|---|---|---|
| FR | 2 854 497 A1 | 11/2004 |
| FR | 2 878 374 A1 | 5/2006 |
| JP | 3-165578 | 7/1991 |
| WO | WO 03/083955 | 10/2003 |
| WO | WO 2006/077343 A1 | 7/2006 |
| WO | WO 2006/085021 A1 | 8/2006 |

* cited by examiner

SEMICONDUCTOR DEVICE WITH HETEROJUNCTIONS AND AN INTERDIGITATED STRUCTURE

CROSS REFERENCE TO RELATED APPLICATION

The present divisional application claims the benefit of priority under 35 U.S.C. 120 to application Ser. No. 11/813,676, filed Jul. 11, 2007, which is a 371 of PCT/FR2006/050021, filed on Jan. 18, 2006, and claims the benefit of priority under 35 U.S.C. 119 from French Application No. 05 50174, filed on Jan. 20, 2005. The entire contents of U.S. application Ser. No. 11/813,676 is hereby incorporated by reference in its entirety.

TECHNICAL FIELD

This invention relates to a semiconductor device with heterojunctions and an interdigitated structure placed on a semiconductor layer of the device, at to the method for production thereof. Such a device can be, for example, a solar cell having an interdigitated structure integrating heterojunctions, and the method is particularly suitable for producing this type of solar cell, on thin-layer silicon.

PRIOR ART

Various technologies are currently used to produce semiconductor devices. In the production of solar cells, two types of technology are primarily used: homojunction cells and heterojunction cells.

The U.S. Pat. No. 4,234,352 describes a homojunction solar cell with an interdigitated structure. This cell comprises a crystalline silicon substrate. This substrate has two opposite surfaces. One of the surfaces, called the front surface, is intended to receive light, while the other surface comprises a plurality of N- or P-doped regions. These regions are placed so as to have interdigitated alignments of identically-doped regions. U.S. Pat. Nos. 6,333,457 and 6,452,090 also describe homojunction solar cells with an identical structure.

A method for producing a surface with contact points for a solar cell with an interdigitated structure and homojunctions is described in U.S. Pat. No. 4,927,770.

A semiconductor device using an interdigitated structure with homojunctions is also described in U.S. Pat. No. 6,426,235. This device comprises a crystalline silicon substrate with a first type of conductivity, on which a crystalline silicon layer doped with a first type of conductivity and a crystalline silicon layer doped with a second type of conductivity opposite the first type of conductivity are stacked. One of the two layers is then etched so as to form an interdigitated structure capable of receiving electrodes.

The patent application EP-A2-0 776 051 describes a solar cell having a similar geometry. A silicon substrate with a first type of conductivity comprises two main opposite surfaces doped with the first type of conductivity. Aluminium ohmic contacts are arranged on one of these surfaces according to an interdigitated structure, with two neighbouring contacts being separated by a distance about equal to their width. A doping with a second type of conductivity opposite the first type of conductivity is then performed on these ohmic contacts.

The French patent application FR 2 854 497 describes a method for producing a semiconductor device with auto-aligned metallizations. The device includes a crystalline silicon substrate. This substrate comprises two main opposite surfaces. A doping with a first type of conductivity is performed on one of these surfaces. Windows are then etched on this surface. As the etching performed is deeper than the thickness of the doping, the windows make is possible to produce dopings with a second type of conductivity opposite the first type of conductivity in the areas of the substrate thus revealed. Metallizations then come into contact with these doped regions. Again, an interdigitated structure with homojunctions is obtained.

All of the cells cited above use an interdigitated structure with homojunctions. The major disadvantage of this type of structure, in particular in the production of solar cells, is the high thermal budget used during the production process. Therefore, to produce good interdigitated cells with homojunctions, it is necessary to have semiconductor materials with a substantial lifetime, preserved throughout the production process. However, this type of material is usually very expensive, and therefore unsuitable for obtaining low-cost solar cells. In consideration of the high thermal budget used, the use of so-called "high-temperature" serigraphic pastes is also necessary.

In addition, the lower the thickness of the semiconductor is, the more effective the interdigitated structure is. However, using such a production process with a high thermal budget leads to considerable thermal stress in the material, and therefore increases the risk of damage in the production process.

The principle of the amorphous/crystalline heterojunction is already known. Solar cells applying this principle have already been patented.

The principle of this type of cell is to use a crystalline semiconductor substrate doped with a first type of conductivity. An amorphous semiconductor layer doped with a second type of conductivity, opposite the first type of conductivity, then comes into contact with one of its surfaces. A PN junction is thus obtained, and is called a heterojunction because the two semiconductors used have different atomic compositions and do not have the same forbidden bandwidth. It is then simply necessary to produce a transparent electrode on a first surface of the junction and, on a second surface opposite this first surface, to produce an ohmic contact electrode in order to obtain a heterojunction solar cell.

By comparison with homojunction cells, there is first an advantage in terms of cost because the production process is performed at low temperature. This makes it possible to avoid the disadvantages mentioned above, which appear in the high-temperature processes. This technology also makes it possible to produce finer cells without a risk of thermal stress, and therefore damage. Finally, when the semiconductors used are silicon, this heterojunction structure makes it possible to use a wider variety of crystalline silicon because high-temperature heat treatments are not associated with a decreased lifetime.

The U.S. Pat. No. 5,066,340 describes a heterojunction solar cell. It comprises a PN junction formed by a crystalline silicon substrate with a first type of conductivity and an amorphous silicon layer with a second type of conductivity, opposite the first type of conductivity, produced on one of the surfaces of the crystalline substrate. This cell also integrates, between the crystalline substrate and the amorphous silicon layer, an intrinsic microcrystalline silicon layer.

The U.S. Pat. No. 5,213,628 also describes a heterojunction solar cell. As in the U.S. Pat. No. 5,066,340, this cell comprises a heterojunction formed by a crystalline silicon substrate with a first type of conductivity and an amorphous silicon layer with a second type of conductivity, opposite the first type of conductivity, produced on one of the surfaces of the crystalline substrate. This cell integrates, between the crystalline substrate and the amorphous silicon layer, an intrinsic amorphous silicon layer.

The major disadvantage of these heterojunction cells is that there is only one possible connection structure: an electrode on the amorphous silicon side and an electrode on the crystalline silicon side.

The document WO 03/083955 describes a semiconductor device comprising, on a surface of a crystalline semiconductor substrate, a first N-doped amorphous semiconductor region and a second P-doped amorphous semiconductor region. The first amorphous semiconductor region and the second amorphous semiconductor region form an interdigitated structure. An intrinsic semiconductor layer is placed between the substrate and the amorphous semiconductor regions to produce the passivation of the substrate surface. A polyimide resin insulating layer is placed between the amorphous semiconductor regions, on the intrinsic semiconductor layer, making it possible to produce the electrical insulation between the amorphous semiconductor regions. In this device, the electrical insulation and the surface passivation require two different layers because the material of the insulating layer is unsuitable for surface passivation.

DESCRIPTION OF THE INVENTION

This invention is intended to propose a semiconductor device with heterojunctions, which does not have the disadvantage mentioned above, namely that of being limited by a connection structure including an electrode on two main opposite surfaces of the device, and which proposes a simpler and more electrically-insulated structure than the existing semiconductor devices with an interdigitated structure.

To achieve these objectives, this invention proposes a semiconductor device comprising, on at least one surface of a crystalline semiconductor substrate, at least one first amorphous semiconductor region doped with a first type of conductivity, which semiconductor substrate comprises, on the same surface, at least one second amorphous semiconductor region doped with a second type of conductivity, opposite the first type of conductivity, wherein the first amorphous semiconductor region, insulated from the second amorphous semiconductor region by at least one dielectric region in contact with the semiconductor substrate, and the second amorphous semiconductor region, form an interdigitated structure.

Thus, instead of using a semiconductor device with heterojunctions not having the advantages of an interdigitated structure, a semiconductor device with heterojunctions and an interdigitated structure is used, combining both the advantages of a heterojunction structure over a homojunction structure, and the advantages of an interdigitated structure, heretofore used only in semiconductor devices with homojunctions.

In addition, the dielectric regions between the amorphous regions extend to the substrate, ensuring both the electrical insulation between the amorphous regions and the passivation of the substrate surface, providing a simpler structure and better electrical insulation between the amorphous semiconductor regions than the existing devices.

The dielectric regions can be made of silicon oxide, silicon nitride or amorphous crystalline silicon.

It is preferable for at least one first metallization area to be in contact with the first amorphous semiconductor region, and for at least one second metallization area to be in contact with the second amorphous semiconductor region, so that the device can be connected to an external environment.

It is also possible for at least one first conductive thermal oxide area to be located between the first metallization area and the first amorphous semiconductor region and for at least one second conductive thermal oxide area to be located between the second metallization area and the second amorphous semiconductor region. These conductive thermal oxide areas make it possible to provide better contact resistivity between the metallization areas and the amorphous semiconductor regions.

In this case, the conductive thermal oxide areas can be made of indium and tin oxide or zinc oxide.

The metallization areas can be based on a noble metal such as silver, or based on aluminium.

The semiconductor substrate can comprise on another surface, opposite the surface having the interdigitated structure, a surface passivation layer coated with an antireflective layer. The surface passivation layer makes it possible to push away the current carriers, and the antireflective layer makes it possible to trap the maximum number of photons entering the device.

The surface passivation layer can be made of an amorphous semiconductor with the first type of conductivity, the second type of conductivity or it is intrinsic.

It is then preferable for the surface passivation layer to be silicon.

The antireflective layer can be made of silicon nitride.

It is possible for the first and/or the second amorphous semiconductor region to be doped gradually, so as to provide a good interface with the semiconductor substrate.

It is also preferable for the semiconductor substrate to be made of monocrystalline silicon or polycrystalline silicon, depending on the type of device desired.

The amorphous semiconductor regions can be made of silicon. This is currently the most widely used material in the production of semiconductor devices with heterojunctions.

The semiconductor substrate can have a certain type of conductivity.

The semiconductor substrate is preferably a thin-layer substrate.

Intrinsic semiconductor regions can be placed between the amorphous semiconductor regions and the substrate, making it possible to provide a good interface with the substrate and preventing recombinations at the level of the substrate.

Such a device can advantageously be a solar cell.

A plurality of solar cells can be combined to form a module, wherein said cells are connected in series and/or in parallel.

This invention also relates to a method for producing a semiconductor device comprising the following steps:

a) producing a first insulating layer on a surface of a semiconductor substrate;

b) etching, in the first insulating layer, at least one first window exposing a portion of the semiconductor substrate;

c) depositing a first amorphous semiconductor layer doped with a first type of conductivity on the first insulating layer and in the first window;

d) etching, in the first amorphous semiconductor layer and the first insulating layer, at least one second window, offset from the first window, exposing a portion of the semiconductor substrate;

e) producing a second insulating layer in the second window and on the first amorphous semiconductor layer;

f) etching at least one first opening in the second insulating layer, at the level of the second window, exposing a portion of the semiconductor substrate;

g) depositing a second amorphous semiconductor layer doped with a second type of conductivity opposite the first type of conductivity in the first opening, and on the second insulating layer;

wherein the first amorphous semiconductor layer and the second amorphous semiconductor layer form an interdigitated structure having a contour defined by the etching of the first window and the first opening.

The method can comprise, between step b) and step c), a step of depositing at least one first intrinsic semiconductor region at least in the first window and/or, between step f) and step g), a step of depositing at least one second intrinsic semiconductor region at least in the first opening.

The method can comprise, between step c) and step d), or between step d) and step e), a step of depositing at least one first metallization area on the first amorphous semiconductor layer.

In another alternative, the method can comprise, between step c) and step d), or between step d) and step e), a step of depositing at least one first conductive thermal oxide area on the first amorphous semiconductor layer, then a step of depositing at least one first metallization area on the first conductive thermal oxide area.

The first metallization area is preferably centred above the first window.

It is also preferable for the size of the first metallization area to be smaller than that of the first window.

The method can comprise, after step g), a step of etching at least one second opening in the second amorphous semiconductor layer and in the second insulating layer, above the first metallization area, of which the size is smaller than or equal to that of the first metallization area, exposing at least a portion of the first metallization area.

The method can also comprise, after step g), a step of depositing at least one second metallization area on the second amorphous semiconductor layer, at the level of the second window, on at least the first opening.

In another alternative, the method can comprise, after step g), a step of depositing at least one second conductive thermal oxide area on the second amorphous semiconductor layer, at the level of the second window, on at least the first opening, then a step of depositing at least one second metallization area on the second conductive thermal oxide area.

It is preferable for the first opening to be smaller than the second window.

This invention also relates to a method for producing a semiconductor device comprising the following steps:

a) depositing at least one first amorphous semiconductor layer doped with a first type of conductivity on a surface of a semiconductor substrate;

b) depositing at least one first metallization area on at least the first amorphous semiconductor layer;

c) removing areas of the first amorphous semiconductor layer not covered by the first metallization area;

d) depositing at least one second amorphous semiconductor layer doped with a second type of conductivity opposite the first type of conductivity on at least the substrate surface;

e) depositing at least one second metallization area on at least the second amorphous semiconductor layer;

f) removing areas of the second amorphous semiconductor layer not covered by the second metallization area, wherein the first amorphous semiconductor layer and the second amorphous semiconductor layer form an interdigitated structure.

Thus, the metallization areas are used as a mask to carry out the etching of the amorphous semiconductor layers. This method is simple and inexpensive to implement because the etching steps require only a simple alignment with respect to the metallization areas in order to be implemented.

The method can comprise, after step f), a step of depositing an insulating layer on at least the substrate surface.

The insulating layer can be a dielectric layer.

The method can comprise, after the step of depositing the insulating layer, a step of producing openings in the insulating layer at the level of the metallization areas so as to make the metallizations accessible for external contacts.

The method can comprise, before step a), a step of depositing at least one intrinsic semiconductor layer on the surface of the substrate, wherein the first amorphous semiconductor layer is then deposited on the intrinsic semiconductor layer and step c) also involves the removal of areas of the intrinsic semiconductor layer not covered by the first metallization area.

The method can also comprise, between step c) and step d), a step of depositing at least one second intrinsic semiconductor layer on at least the surface of the substrate, wherein the second amorphous semiconductor layer is then deposited on the second intrinsic semiconductor layer and step f) also involves the removal of areas of the second intrinsic semiconductor layer not covered by the second metallization area.

At least one of steps c) and/or f) of removing semiconductor areas can be performed by etching.

The method can comprise the following steps:
depositing a surface passivation layer onto another surface, opposite the surface having the interdigitated structure, of the semiconductor substrate;
depositing an antireflective layer on the surface passivation layer.

These two steps are preferably performed before step a).

At least one etching operation can be performed by laser or by serigraphy with etching pastes.

At least one etching operation can be a selective etching operation making it possible to etch the amorphous semiconductor and not the metal.

The substrate is preferably, before step a), first chemically cleaned by a conventional RCA cleaning (cleaning process developed by the RCA company) and a hydrofluoric acid cleaning.

BRIEF DESCRIPTION OF THE DRAWINGS

This invention can be better understood on reading the description of embodiment examples provided purely for indicative purposes, which are in no way limiting, in reference to the appended drawings, in which.

Identical, similar or equivalent parts of the various figures described below have the same numeric references for the sake of consistency between figures.

The various parts shown in the figures are not necessarily shown according to a uniform scale, so as to make it easier to read the figures.

DETAILED DESCRIPTION OF SPECIFIC EMBODIMENTS

Figure 1A:
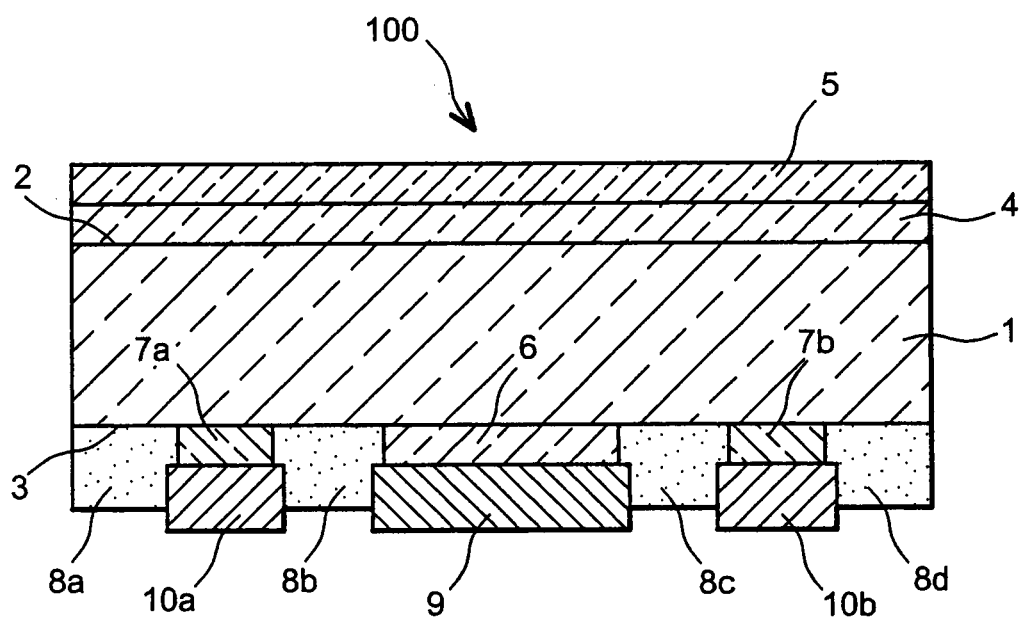
FIG. 1A shows a cross-section of a semiconductor device according to the invention.

Reference is made to FIG. 1A, which shows a cross-section of an example of a semiconductor device 100 with heterojunctions and an interdigitated structure, according to this invention. The semiconductor device 100 comprises, on at least one surface 3 of a crystalline semiconductor substrate 1, at least one first amorphous semiconductor region 6. This first region 6 is doped with a first type of conductivity. The semiconductor substrate 1 also comprises, on the surface 3, at least one second amorphous semiconductor region 7a, 7b. This second region 7a, 7b is doped with a second type of conductivity, opposite the first type of conductivity. These amorphous semiconductor regions 6, 7a, 7b form an interdigitated structure. In this example, the semiconductor device 100 is a solar cell.

The semiconductor device 100 comprises the semiconductor substrate 1 that is considered in this example to be a thin layer. This semiconductor 1 can be, for example, monocrystalline or polycrystalline silicon. It is not necessary to use a very high-quality silicon because, given the absence of strong thermal constraints during the semiconductor device 100 production process, the lifetime of the silicon current carriers will not be altered. The thickness of the thin-layer semiconductor substrate 1 can be between, for example, 10 micrometers and several hundred micrometers. The semiconductor substrate 1 can have a certain type of conductivity. In the example shown in FIG. 1A, the semiconductor substrate 1 is of type N.

The semiconductor substrate 1 comprises the surface 3 that, in this example, is on the side of the rear surface of the solar cell. The semiconductor substrate 1 comprises another surface 2, opposite the surface 3, which is on the side of the front surface of the solar cell. It is the front surface of the solar cell that is exposed to light.

The semiconductor substrate 1 comprises, on the surface 3, at least one first amorphous semiconductor region 6 doped with a first type of conductivity. In the example shown in FIG. 1A, the semiconductor substrate 1 comprises, on the surface 3, a single first region 6. This first region 6 is, for example, N-doped amorphous silicon. The thickness of the first amorphous semiconductor region 6 can be between, for example, around several nanometers and several dozen nanometers. The first amorphous semiconductor region 6 can be gradually doped (lowest doping near the surface 3 of the substrate 1) so as to provide a good interface with the semiconductor substrate 1.

The semiconductor substrate 1 also comprises, on the surface 3, at least one amorphous second region 7a, 7b doped with a second type of conductivity, opposite the first type of conductivity. In the example shown in FIG. 1A, the semiconductor substrate 1 has, on the surface 3, two second regions 7a, 7b, produced on each side of the first region 6. It is considered that these two second regions 7a, 7b are made of P-doped amorphous silicon. The thickness of the second amorphous semiconductor regions 7a, 7b can be between, for example, around several nanometers and several dozen nanometers. The second amorphous semiconductor regions 7a, 7b can be gradually doped (lowest doping near the surface 3 of the substrate 1) so as to provide a good interface with the semiconductor substrate 1. The thickness of the first region 6 can be different from the thickness of the second regions 7a, 7b.

Figure 1B:
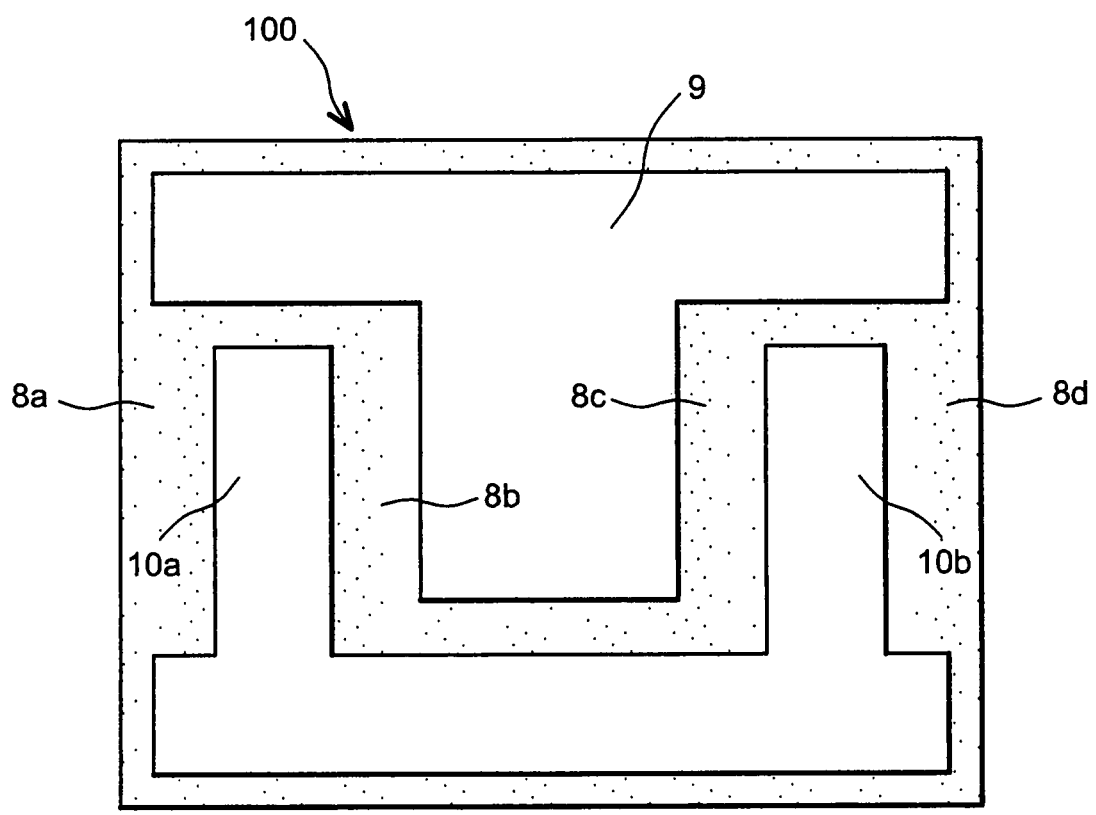
FIG. 1B shows a bottom view of a semiconductor device according to the invention.
Figure 1C:
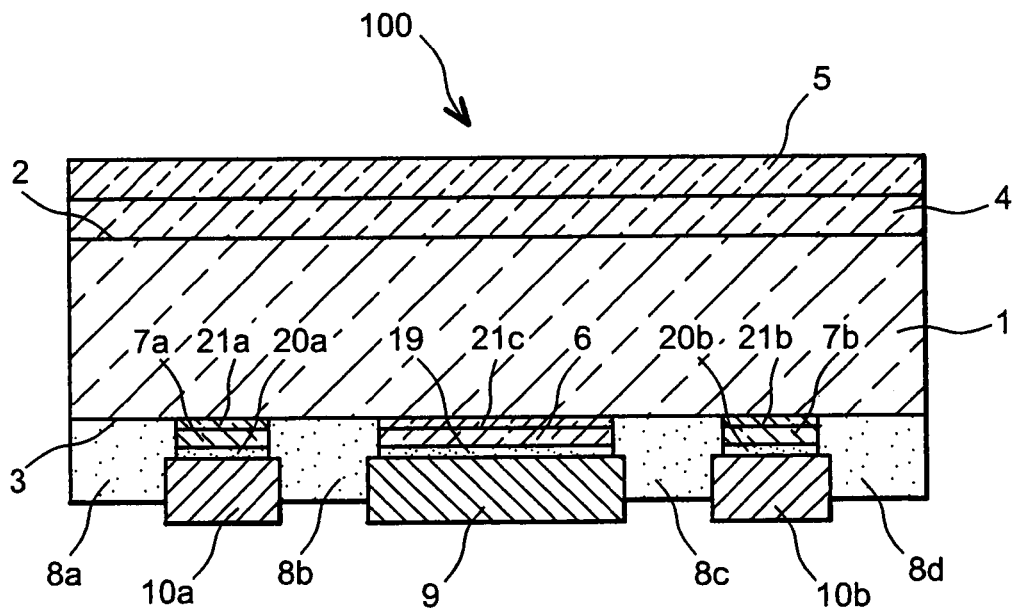
FIG. 1C shows a cross-section of a semiconductor device according to the invention.

Intrinsic semiconductor regions 21a, 21b, 21c can be placed between the amorphous semiconductor regions 6, 7a, 7b and the surface 3 of the substrate 1, as shown in FIG. 1C. These regions 21a, 21b, 21c make it possible to provide a good interface with the substrate 1 by preventing recombinations at the level of the surface 3 of the substrate 1.

Dielectric regions 8a, 8b, 8c, 8d are inserted between the amorphous semiconductor regions 6, 7a, 7b. These dielectric regions 8a, 8b, 8c, 8d have a role of providing insulation between two amorphous semiconductor regions having different types of conductivity. They make it possible to prevent a short-circuit between these two regions. These insulating regions 8a, 8b, 8c, 8d can be, for example, silicon oxide, silicon nitride or amorphous crystalline silicon. In the example shown in FIG. 1A, the thickness of the insulating regions 8a, 8b, 8c, 8d is greater than the thickness of the amorphous semiconductor regions 6, 7a, 7b. These dielectric regions 8a, 8b, 8c, 8d extend to the substrate 1, ensuring both the electrical insulation between the regions 6, 7a and 7b and the passivation of the surface 3 of the substrate 1.

The first amorphous semiconductor region 6 is connected to at least one first metallization area 9. This metallization area 9 is a first connection electrode for the semiconductor device 100. The first metallization area 9 at least partially covers the first amorphous semiconductor region 6.

Similarly, the second amorphous semiconductor regions 7a, 7b are connected to at least one second metallization area 10a, 10b. In the example shown in FIG. 1A, two second metallization areas 10a, 10b are respectively connected to the two second regions 7a, 7b, and at least partially cover them. Connected together, the second metallization areas 10a, 10b form the second connection electrode of the semiconductor device 100.

To ensure better contact resistivity between the metallization areas 9, 10a, 10b and the amorphous semiconductor regions 6, 7a, 7b, conductive thermal oxide areas 19, 20a, 20b can be inserted between the metallization areas 9, 10a, 10b and the amorphous semiconductor regions 6, 7a, 7b. In FIG. 1C, a first conductive thermal oxide area 19 is located between the first metallization area 9 and the first amorphous semiconductor region 6. Respectively, two conductive thermal oxide areas 20a, 20b are located between the second metallization areas 10a, 10b and the second amorphous semiconductor regions 7a, 7b. These conductive thermal oxide areas 19, 20a, 20b can, for example, be made of indium and tin oxide or zinc oxide.

Each of the metallization areas 9, 10a, 10b can also be in contact with the insulating regions 8a, 8b, 8c, 8d adjacent to the amorphous silicon regions 6, 7a, 7b. The first metallization area 9 must not be in contact with the second metallization areas 10a, 10b because this would cause a short-circuit between the regions 6, 7a, 7b doped with different conductivities.

The metallization areas 9, 10a, 10b can be based on a noble metal, such as silver, or based on aluminium.

The semiconductor substrate 1 comprises, on another surface 2, opposite the surface 3, a surface passivation layer 4. This surface passivation layer 4 makes it possible to push away the current carriers toward the surface 3 of the semiconductor substrate 1. This surface passivation layer 4 can be, for example, made of intrinsic amorphous silicon, or amorphous silicon doped with a certain type of conductivity. The heterojunction technology makes it possible to use very fine surface passivation layers, particularly suitable for thin silicon.

The surface passivation layer 4 is covered with an antireflective layer 5. This antireflective layer 5 enables a maximal number of photons to penetrate the semiconductor substrate 1, and does not allow them to leave. The antireflective layer 5 can be, for example, made of silicon nitride or other materials conventionally used for this function, such as magnesium fluoride or zinc sulphide.

As shown in FIG. 1B, the metallization areas 9, 10a, 10b each form a finger. The insulating regions 8a, 8b, 8c, 8d separate the second metallization areas 10a, 10b from the first metallization area 9. The structure thus formed is an interdigitated structure. The first metallization area 9 forms a first electrode, and the second metallization areas 10a, 10b, which are connected to one another, form a second electrode.

We will now describe a first method for producing another example of a semiconductor device 100, also according to the invention. It is considered that the semiconductor device 100 thus produced is a solar cell.

Figure 2:
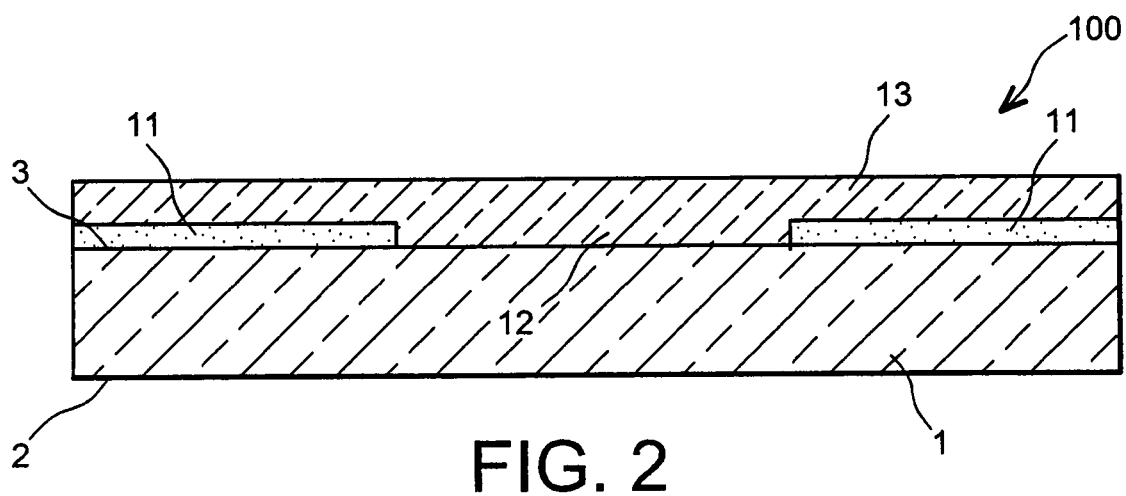
FIGS. 2, 3, 4A, 4B and 4C show various steps of a method according to the invention for producing a semiconductor device according to the invention.

As shown in FIG. 2, we start with a semiconductor substrate 1, for example made of N-type silicon, which in this example is considered to be a thin layer. The surfaces of the semiconductor substrate 1 will be identified by a surface 3 and another surface 2, opposite surface 3.

Before producing the solar cell 100, the semiconductor substrate 1 is first chemically cleaned on its surfaces 2 and 3. A conventional RCA cleaning and a hydrofluoric acid cleaning are, for example, preferable in order to prevent any metal contamination resulting from texturization and to prepare the surfaces of the semiconductor substrate 1 before any deposition. The conventional RCA cleaning consists of using a first cleaning bath based on deionised water, ammonia and oxygenated water, and a second cleaning bath based on deionised water, hydrochloric acid and oxygenated water. The other surface 2 can be treated at the beginning or at the end of the process. However, it is preferable to treat the other surface 2 at the beginning so as to obtain a better passivation quality, since it will be difficult later to perform a hydrofluoric acid treatment on a single side of the silicon without performing a time-consuming and costly process to protect the surface 3.

It will therefore be important to pay close attention to the surface condition of the other surface 2 during the treatment of surface 3.

Therefore, on the other surface 2 of the semiconductor substrate 1, a first deposition of a surface passivation layer 4 is performed (shown in FIG. 1). This surface passivation layer 4 can be, for example, an intrinsic amorphous silicon layer. The surface passivation layer 4 can also be made of amorphous silicon with a certain type of conductivity. This surface passivation layer 4 extends over the entire area of the other surface 2 of the semiconductor substrate 1. This deposition can, for example, be performed by a plasma-enhanced chemical vapour deposition technique (PECVD).

An antireflective layer 5 is provided on top of this surface passivation layer 4 (shown in FIG. 1). This antireflective layer 5 is, for example, silicon nitride. This antireflective layer 5 extends over the entire surface of the surface passivation layer 4. It can be deposited, for example, by a low-pressure chemical vapour deposition technique (LPCVD), or by PECVD.

After these two operations, the rear surface of the semiconductor device 100 is produced.

A first insulating layer 11 is produced on the other surface 3 of the semiconductor substrate 1. It extends over the entire area of the other surface 3 of the semiconductor substrate 1. This first layer 11 will make it possible later to insulate the amorphous silicon regions with different types of conductivity. This first insulating layer 11 can be, for example, silicon nitride. It can also be made with silicon oxide. In the case of a first insulating layer 11 made of silicon nitride, it can be obtained by LPCVD or PECVD. Otherwise, in the case of a first insulating layer 11 made of silicon oxide, it can be produced by PECVD.

At least one first window 12 is then etched in the first insulating layer 11, exposing a portion of the semiconductor substrate 1. This first window 12 can be produced by laser etching or by applying a serigraphic paste capable of etching the insulating material of the first insulating layer 11.

Then, a first amorphous semiconductor layer 13 doped with a first type of conductivity is deposited. This semiconductor can, for example, be N-doped amorphous silicon. This deposition can, for example, be performed by PECVD. In the case of an N-type doping, it can be produced, for example, with phosphorus. This first N-doped amorphous semiconductor layer 13 is gradually doped to provide a good interface with the semiconductor substrate 1. The deposition of this first amorphous semiconductor layer 13 is perfumed both in the first window 12 and on the entire surface of the first insulating layer 11.

Figure 4A:
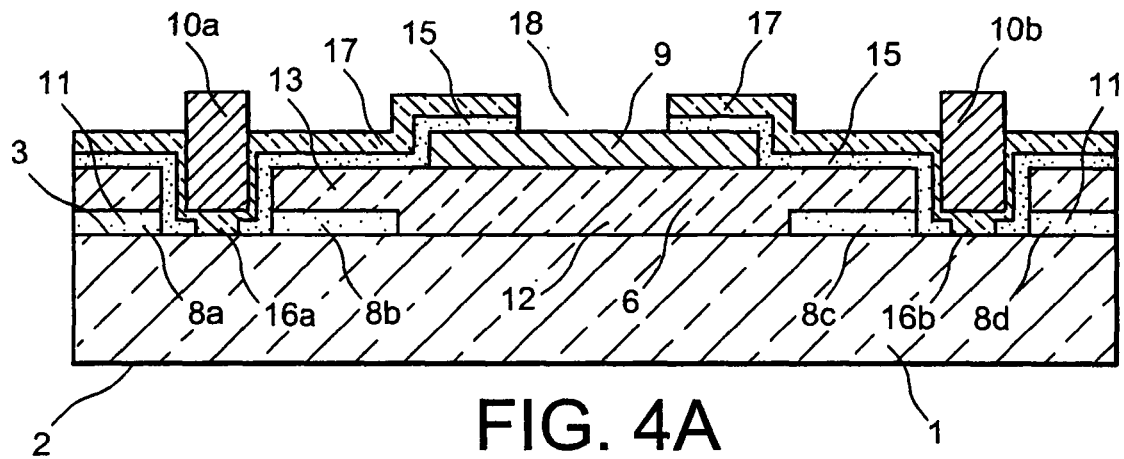
Figure 4B:
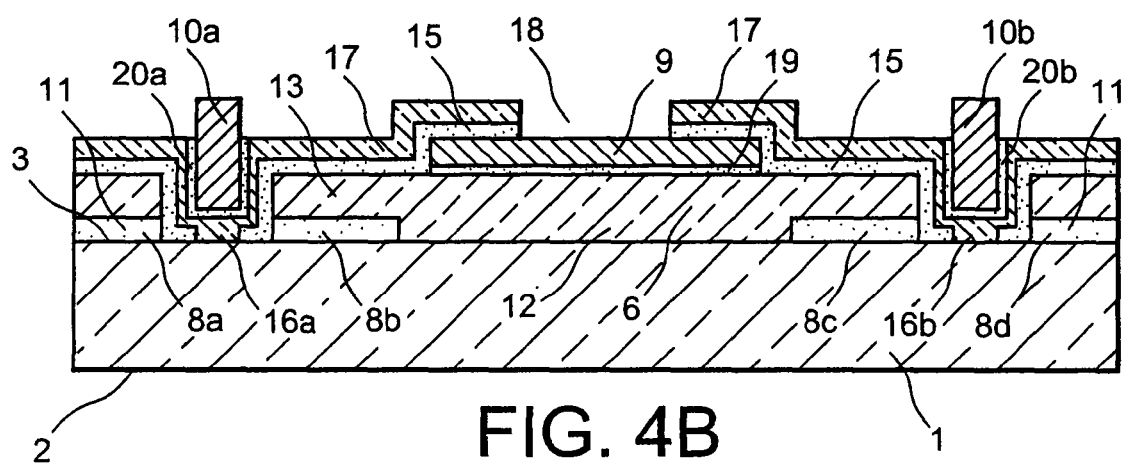
Figure 4C:
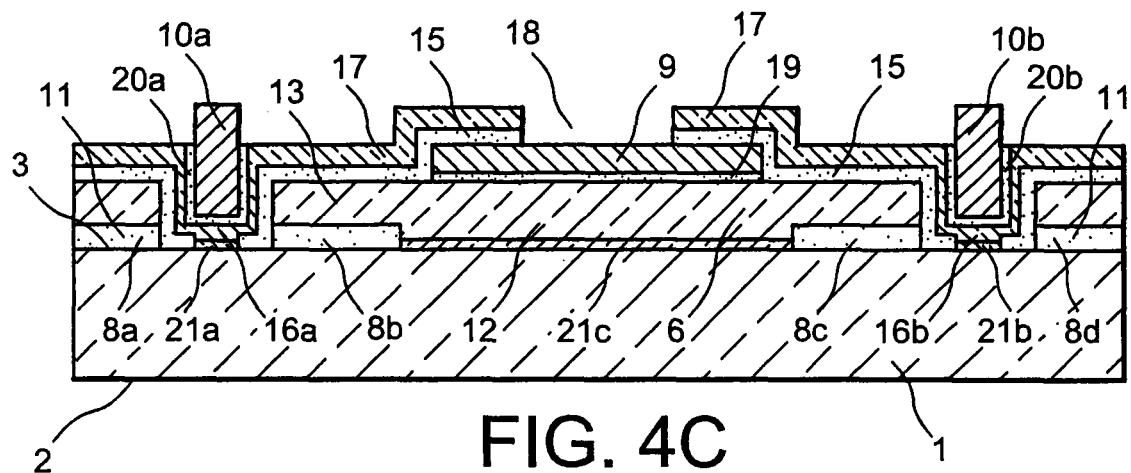

It is also possible to perform, before depositing the first layer 13, a deposition of a first intrinsic semiconductor region 21c, shown in FIG. 4C, in the first window 12. A good interface is thus provided with the substrate 1 by preventing recombinations at the level of the surface 3 of the substrate 1.

Figure 3:
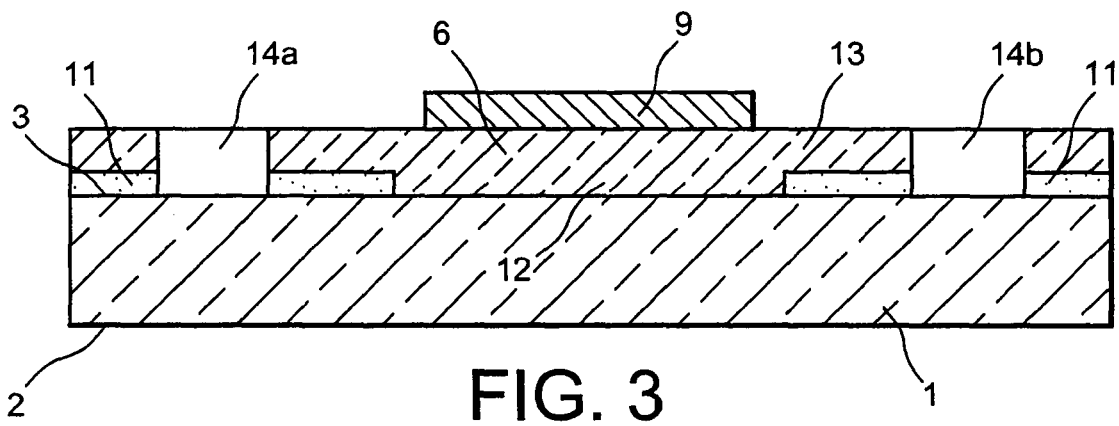

As shown in FIG. 3, the deposition of at least one first metallization area 9 is performed on the first amorphous semiconductor layer 13. This first metallization area 9 can be, for example, centred above the first window 12. In the example shown in FIG. 3, the first metallization area 9 is smaller than the first window 12 and is centred above it. The thickness of this first metallization area 9 is about several dozen micrometers. The deposition of this first metallization area 9 can be performed by evaporation, sputtering, serigraphy of metallic pastes, or by electrochemical deposition. This first metallization area 9 is, for example, based on a noble metal such as silver, or based on aluminium.

At least one second window 14a, 14b is then etched in the first amorphous semiconductor layer 13 and the first insulating layer 11. In the example shown in FIG. 3, two second windows 14a, 14b are etched in the first amorphous semiconductor layer 13 and the first insulating layer 11 so as to expose a portion of the semiconductor substrate 1. These second windows 14a, 14b can be produced by laser etching or by applying serigraphic pastes capable of etching the amorphous semiconductor layer 13 and the first insulating layer 11. The second windows 14a, 14b are offset on each side of the first window 12. The etching of these two second windows 14a, 14b divides the amorphous semiconductor layer 13 into a plurality of portions, thus defining at least one first region 6 doped with the first type of conductivity.

When producing the semiconductor device 100, the etching of the second windows 14a, 14b can be performed before the deposition of the first metallization area 9.

As shown in FIG. 4A, a second insulating layer 15 is then produced. This second insulating layer 15 covers the first metallization area 9, the first amorphous semiconductor layer 13, as well as the portions of the semiconductor substrate 1 exposed by the second windows 14a, 14b. This second insulating layer 15 can be, for example, silicon nitride. It can also be produced with a silicon oxide layer. In the case of a second insulating layer 15 made of silicon nitride, it is possible to obtain it by LPCVD or PECVD. Finally, in the case of a second insulating layer 15 made of silicon oxide, it can be produced by PECVD.

At least one first opening 16a, 16b is then etched in the second insulating layer 15, at the level of the two second windows 14*a*, 14*b*, exposing a portion of the semiconductor substrate 1. In the example shown in FIG. 4A, two first openings 16*a*, 16*b* are produced and each of the two first openings 16*a*, 16*b* has a smaller area than its second respective window 14*a*, 14*b*. These two first openings 16*a*, 16*b* can be produced by laser etching or by serigraphy with etching pastes. The etching of these two first openings 16*a*, 16*b* divides the insulating layers 11 and 15 into a plurality of portions, thus defining the insulating regions 8*a*, 8*b*, 8*c*, 8*d*.

The deposition of a second amorphous semiconductor layer 17 doped with a second type of conductivity, opposite the first type of conductivity, is then performed. This semiconductor can therefore be, for example, P-doped amorphous silicon. This deposition can, for example, be performed by PECVD. In the case of a P-type doping, it can be performed, for example, with boron. This second P-doped amorphous semiconductor layer 17 is gradually doped to provide a good interface with the semiconductor 1. The deposition of this second amorphous semiconductor layer 17 is performed both in the first openings 16*a*, 16*b* but also on the entire surface of the second insulating layer 15. The first amorphous semiconductor layer 13 and the second amorphous semiconductor layer 17 form an interdigitated structure, with a contour defined by the etching of the first window 12 and the first openings 16*a*, 16*b*.

It is also possible to perform, before the deposition of the second layer 17, a deposition of second intrinsic semiconductor regions 21*a*, 21*b*, shown in FIG. 4C, in the first openings 16*a*, 16*b*. Like region 21*c*, the intrinsic semiconductor regions 21*a*, 21*b* provide a good interface with the substrate 1 by preventing recombinations at the level of the surface 3 of the substrate 1.

The deposition of at least one second metallization area 10*a*, 10*b* is then performed on the amorphous semiconductor layer 17, in the second windows 14*a*, 14*b*, at least at the level of the first openings 16*a*, 16*b*. In the example shown in FIG. 4*a*, two second metallization areas 10*a*, 10*b* are produced. The deposition of these second metallization areas 10*a*, 10*b* can be performed by evaporation, sputtering, serigraphy of metallic pastes, or by electrochemical deposition. These second metallization areas 10*a*, 10*b* are, for example, based on a noble metal such as silver, or based on aluminium.

Finally, at least one second opening 18 is then etched in the second amorphous semiconductor layer 17, and the second insulating layer 15, above the first metallization area 9. This second opening 18 is produced so as to access the first metallization area 9. A second opening 18 is preferably etched with a smaller area than the first metallization area 9 and centred above said first metallization area 9. This second opening 18 can be produced by laser etching or by applying serigraphic pastes capable of etching the second amorphous semiconductor layer 17 and the second insulating layer 15.

In addition, in all of the embodiments described, it is advantageously possible to insert, between the amorphous silicon layers 13, 17 and the metallizations 9, 10*a*, 10*b*, conductive thermal oxide areas 19, 20*a*, 20*b*, as shown in FIGS. 4B and 4C. These conductive thermal oxide areas 19, 20*a*, 20*b* can be, for example, made of indium and tin oxide or zinc oxide. These areas make it possible to ensure better contact resistivity between the metallizations 9, 10*a*, 10*b* and the amorphous semiconductor 13, 17.

FIGS. 5, 6, 7A and 7B show the steps of a second method for producing another example of a semiconductor device 100, also according to this invention. It is considered that the semiconductor device 100 thus produced is a solar cell.

This method uses a semiconductor substrate 1 identical to the one used in the first method, according to this invention. As in the first method, it is possible to chemically clean the surfaces 2 and 3 of the substrate 1 by a conventional RCA cleaning and a hydrofluoric acid cleaning. It is also possible to provide, on the other surface 2, of the substrate 1, a surface passivation layer 4 and an antireflective layer 5, as shown in FIG. 1.

Figure 5:
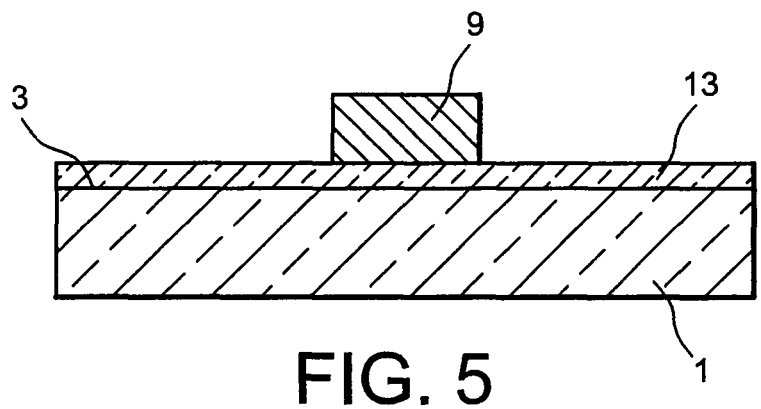
FIGS. 5, 6, 7A and 7B show various steps of a method according to the invention for producing a semiconductor device according to the invention.

As shown in FIG. 5, a first amorphous semiconductor layer 13 doped with a first type of conductivity is deposited on the surface 3 of the substrate 1. This semiconductor can, for example, be N-doped amorphous silicon. This deposition can, for example, be performed by PECVD. In the case of N-type doping, it can be performed, for example, which phosphorus. This first N-doped amorphous semiconductor layer 13 can be gradually doped to provide a good interface with the semiconductor substrate 1. The deposition of this first amorphous semiconductor layer 13 is performed on the entire surface 3 of the substrate 1.

Figure 7A:
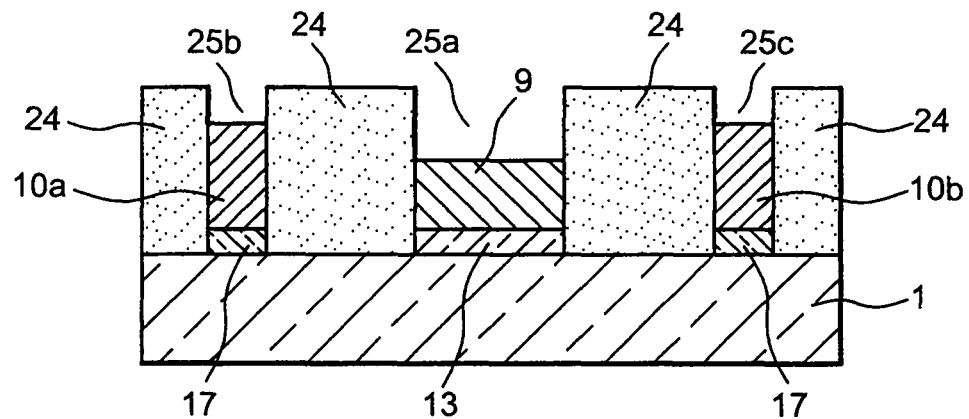
Figure 7B:
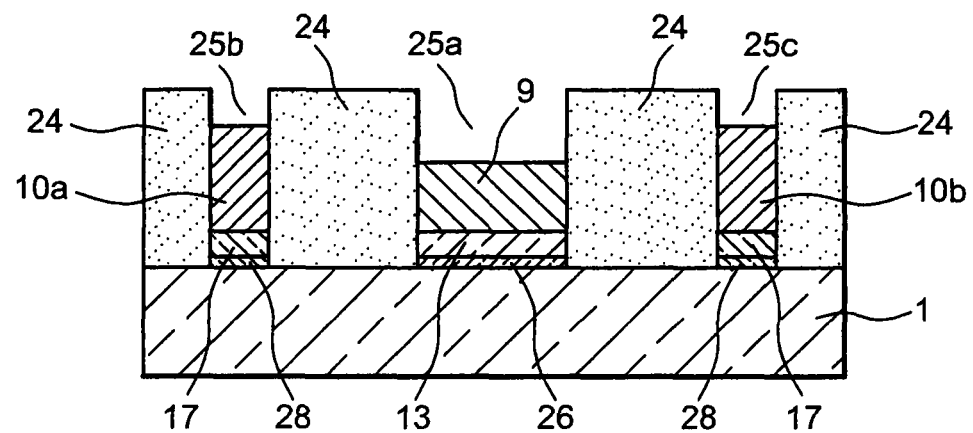
Figure 8:
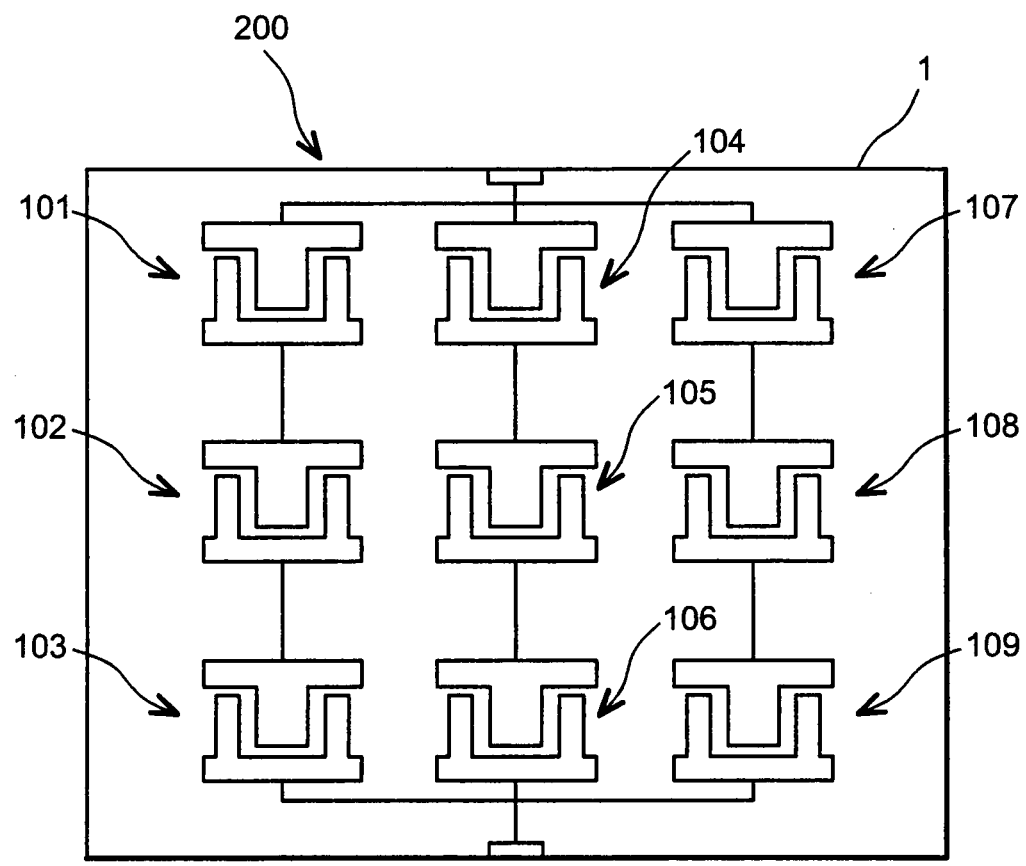
FIG. 8 shows a bottom view of a module formed by a plurality of solar cells connected to one another, also according to this invention.

It is also possible to perform, before the deposition of the first layer 13, a deposition of a first intrinsic semiconductor layer 26, shown in FIG. 7B. A good interface is thus provided with the substrate 1 by preventing recombinations at the level of the surface 3 of the substrate 1.

Then at least one first metallization area 9 is deposited on the first amorphous semiconductor layer 13. The thickness of this first metallization area 9 is around several dozen micrometers. The deposition of this first metallization area 9 can be performed by evaporation, sputtering, serigraphy of metallic pastes, or by electrochemical deposition. This first metallization area 9 is, for example, based on a noble metal such as silver, or based on aluminium.

Areas of the first amorphous semiconductor layer 13, and optionally of the intrinsic semiconductor layer 26, not covered by the first metallization area 9, are then removed. This step can, for example, be performed by dry or wet etching, or by selective etching making it possible to etch only the amorphous semiconductor and not the metal.

Figure 6:
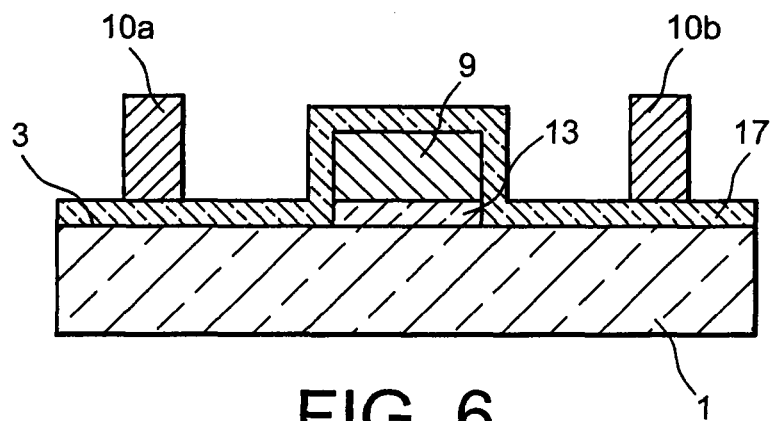

As shown in FIG. 6, the deposition of a second amorphous semiconductor layer 17 doped with a second type of conductivity, opposite the first type of conductivity, is then deposited. This semiconductor can therefore be P-doped amorphous silicon. This deposition can be performed, for example, by PECVD. In the case of P-type doping, it can be performed, for example, with boron. This second P-doped amorphous semiconductor layer 17 can be gradually doped to provide a good interface with the semiconductor substrate 1.

Again, it is also possible to perform, before the deposition of the second amorphous semiconductor layer 17, a deposition of a second intrinsic semiconductor layer 28, as shown in FIG. 7B.

The deposition of second metallization areas 10*a*, 10*b* is then performed on the amorphous semiconductor layer 17. In the example shown in FIG. 6, two second metallization areas 10*a*, 10*b* are performed on the second amorphous semiconductor layer 17. The deposition of these second metallization areas 10*a*, 10*b* can be performed by evaporation, sputtering, serigraphy of metallic pastes, or by electrochemical deposition. These second metallization areas 10*a*, 10*b* are, for example, based on a noble metal such as silver, or based on aluminium.

Areas of the second amorphous semiconductor layer 17, and optionally of the second intrinsic semiconductor layer 28, not covered by the second metallization areas 10*a*, 10*b*, are then removed. This step can, for example, be performed by dry or wet etching, or by selective etching making it possible to etch only the amorphous semiconductor and not the metal of the metallizations 10*a*, 10*b*.

An insulating layer 24, for example a dielectric layer, is then deposited on the surface 3 of the substrate 1 and on the metallizations 9, 10a, 10b.

Openings 25a, 25b, 25c are then produced in the insulating layer 24, at the level of the metallizations 9, 10a, 10b. The metallizations 9, 10a, 10b thus become accessible from the external environment.

In addition, in all of the embodiments described, it is advantageously possible to insert, between the amorphous silicon layers 13, 17 and the metallizations 9, 10a, 10b, conductive thermal oxide areas 19, 20a, 20b, as shown in FIGS. 4B and 4C. These conductive thermal oxide areas 19, 20a, 20b can be, for example, made of indium and tin oxide or zinc oxide. These areas make it possible to ensure better contact resistivity between the metallizations 9, 10a, 10b and the amorphous semiconductor 13, 17.

As shown in FIG. 5, a plurality of semiconductor devices 101 to 109, according to the invention, can be produced at the same time on the semiconductor substrate 1. The unitary devices can then be connected to one another by their metallization areas in order to obtain a module 200 of solar cells. In our example shown in FIG. 5, the devices 101 to 103 are connected in series, as are devices 104 to 106 and devices 107 to 109. The three series-connected groups of cells thus formed are then connected in parallel.

Although a number of embodiments of this invention have been described in detail, it should be understood that various changes and modifications can be made without going beyond the scope of the invention. In the examples described, the first type of conductivity is of type N and the second is of type P. It is of course possible for this to be reversed. A person skilled in the art would have no difficulty choosing the appropriate materials with these conductivities.

The invention claimed is:

1. A semiconductor device comprising:
on at least one surface of a layer made of a crystalline semiconductor material of a certain type of conductivity, a layer made of an amorphous semiconductor material, doped with a type of conductivity opposite to a type of conductivity of the layer made of the crystalline semiconductor material,
wherein a concentration of doping elements in the layer made of the amorphous semiconductor material varies gradually,
said layer made of amorphous semiconductor material is made of silicon,
said layer made of crystalline semiconductor material is made of monocrystalline or polycrystalline silicon;
a metallization area on the layer made of the amorphous semiconductor material; and
a conductive thermal oxide area between the metallization area and the layer made of the amorphous semiconductor material.

2. The semiconductor device according to claim 1, wherein said conductive thermal oxide area is made of a transparent conductive oxide.

3. The semiconductor device according to claim 2, wherein the transparent conductive oxide is indium and tin oxide.

4. The semiconductor device according to claim 2, wherein the transparent conductive oxide is zinc oxide.

5. An apparatus comprising:
a solar cell made of the semiconductor device according to claim 1.

6. The semiconductor device according to claim 1, wherein said concentration of the doping elements in the layer made of the amorphous semiconductor material gradually increases from the layer made of the crystalline semiconductor material.

* * * * *